United States Patent [19]

Brunner et al.

[11] Patent Number: 4,954,705

[45] Date of Patent: Sep. 4, 1990

[54] METHOD FOR EXAMINING A SPECIMEN IN A PARTICLE BEAM INSTRUMENT

[75] Inventors: Matthias Brunner, Kirchheim; Burkhard Lischke, Muenchen, both of Fed. Rep. of Germany

[73] Assignee: Siemens Aktiengesellschaft, Berlin and Munich, Fed. Rep. of Germany

[21] Appl. No.: 416,996

[22] Filed: Oct. 2, 1989

[30] Foreign Application Priority Data

Jan. 25, 1989 [DE] Fed. Rep. of Germany ....... 3902165

[51] Int. Cl.$^5$ .............................................. H01J 37/28
[52] U.S. Cl. .................................. 250/310; 250/307; 250/309; 250/311; 313/336; 313/420
[58] Field of Search ............... 250/310, 307, 309, 311; 313/420, 336

[56] References Cited

U.S. PATENT DOCUMENTS

| | | | |
|---|---|---|---|
| 1,943,109 | 1/1934 | Coolidge | 313/420 |
| 3,374,386 | 3/1968 | Charbonnier et al. | 313/336 |
| 3,875,416 | 4/1975 | Spicer | 250/307 |
| 4,724,328 | 2/1988 | Lischke | 250/492.2 |
| 4,769,543 | 9/1988 | Plies | 250/310 |
| 4,853,545 | 8/1989 | Rose | 250/396 R |

OTHER PUBLICATIONS

May, P. et al., "Picosecond Photoelectron Scanning Electron Microscope for Noncontact Testing of Integrated Circuits", Appl. (R2).

van Gorkon, G. G. P. et al., "Silicon Cold Cathodes as Possible Sources in Electron Lithography Systems", J. Vac. Sci. Technol. 5(4), SR1 International Technical Note 2, Nov. 1984.

Phys. Lett. 51(2), Jul. 13, 1987, p. 145 and abstract.

*Primary Examiner*—Jack I. Berman
*Assistant Examiner*—Kiet T. Nguyen
*Attorney, Agent, or Firm*—Hill, Van Santen, Steadman & Simpson

[57] ABSTRACT

For localization of the defects on mask and wafers generated by particle occupation, electron-optical imaging methods have been developed where the subject to be examined is scanned with a focused electron beam. Since the signal-to-noise ratio needed for a reliable defect recognition limits the scan rate, the throughput of inspected subjects remains low. It is therefore proposed that the subject be scanned with a line-shaped electron probe and that the triggered secondary electrons be imaged onto a detector with the assistance of an electron optics comprising an immersion lens, whereby one line element of the surface region illuminated by the electron probe is assigned to each detector element.

13 Claims, 3 Drawing Sheets

METHOD FOR EXAMINING A SPECIMEN IN A PARTICLE BEAM INSTRUMENT

BACKGROUND OF THE INVENTION

1. Field of the Invention

The present invention relates to a method for examining a specimen in a particle beam instrument, whereby the specimen is irradiated with a particle probe and secondary particles triggered by the particle probe are documented.

2. Description of the Prior Art

There is an increasing need for imaging methods in all areas of development and manufacture of micro-electronic and opto-electronic components in order to be able to visually evaluate micrometer structures, to identify deviations from rated patterns and to localize the defects produced on masks and wafers by particle occupation. Due to the low depth of field, light-optical methods can only be utilized within limits for defect recognition in submicrometer structures. Electron-optical imaging methods were therefore developed wherein the subject to be examined is scanned with a focused electron beam and the current of secondary electrons modulated by topography, material or voltage contrast is registered in a detector. Since the signal-to-noise ratio need for a reliable defect recognition limits the scan rate, these methods allow only a low throughput of inspected subjects.

SUMMARY OF THE INVENTION

The object of the present invention is to provide a method of the species initially set forth above that guarantees a high throughput of inspected subjects.

The object is achieved according to the present invention with a method which is particularly characterized in that a particle probe having a line-shaped cross section is generated and directed onto a specimen, and in that a line-shape secondary particle source generated as a result thereof is imaged on a detector arranged above an objective lens of the particle beam instrument.

The advantage that may be obtained in practicing the present invention is that defects caused on masks and wafers by particle occupation can be very quickly localized, whereby the resolution corresponds to that of known, particle-optical imaging methods.

According to a particular feature of the invention, the secondary particle source is imaged into a line-shaped detector composed of a multitude of particle-sensitive elements.

Another feature of the invention is that the secondary particles are deflected above the objective lens and are documented in the detector arranged outside of an optical axis of the particle beam instrument.

Another feature of the invention is that the secondary particles are deflected through the use of a Wien filter.

Another feature of the invention is that the secondary particles are deflected through the use of an electrical or magnetic multi-pole element.

According to another feature of the invention, the secondary particle source is imaged using an immersion lens which serves as an objective lens.

Another feature of the invention is that a particle probe is generated which is composed of a plurality of sub-beams.

According to another feature of the invention, the particle beams are each supplied from a particle source and the particle sources are arranged line-like.

According to another feature of the invention, the particle probe is generated by imaging a diaphragm aperture illuminated by a primary beam.

According to another feature of the invention, the particle probe is generated using a particle source providing a blade-shaped cathode.

According to another feature of the invention, the specimen is scanned in a planar manner by deflecting the particle probe.

According to another feature of the invention, the specimen is displaced relative to the particle probe.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
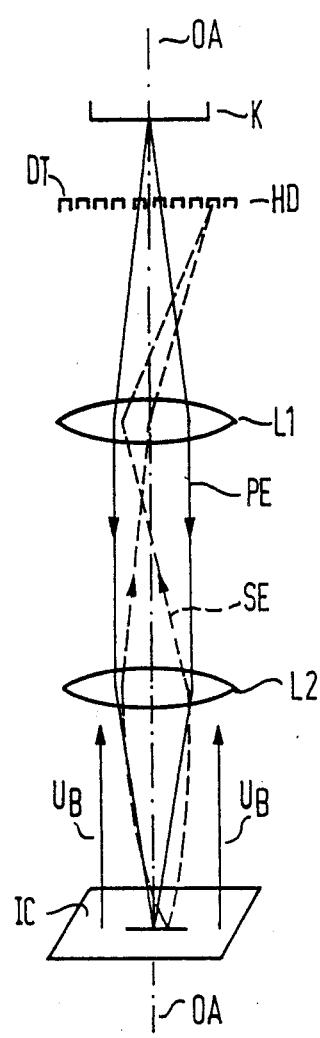
FIG. 1 is a schematic illustration of apparatus for implementing the method of the present invention.

An electron beam measuring instrument is schematically illustrated in FIG. 1 and is particularly suited for the implementation of the method of the present invention. It is essentially composed of a beam generator comprising a blade-shaped cathode K, an electron optics for focusing the primary electrons PE emitted by the cathode K and accelerated in the direction of an anode onto the specimen IC to be investigated and a detector DT for the documentation of the secondary electrons SE triggered on the specimen IC. An electron optics comprising the lens L1 and L2 is provided in the illustrated exemplary embodiment, the electron optics imaging the primary electron source, that is line-shaped because of the cathode geometry, magnified onto the specimen IC arranged immediately beneath the lens L2. An immersion lens serves as an objective lens L2 whose electric field adjoins that decelerates the primary electrons PE and accelerates the triggered secondary electrons SE opposite the primary beam direction. The strength of the electrical retardation or, respectively, accelerating field (symbolized by the arrows referenced $U_B$) built up in the spatial region between the lens L2 and the specimen IC is thereby dimensioned such that the electron optics generates a magnified image of the secondary electron source, that is likewise line-shaped because of the beam spot geometry, on the detector DT arranged in the beam path above the lens L1 (in FIG. 1, only the beam path for the secondary electrons SE triggered at a point line outside of the optical axis OA is illustrated). A line-shaped arrangement of semiconductor diodes particularly comes into consideration as the detector DT, whereby a line element of the surface region respectively illuminated by the primary beam is assigned to each detector element HD. Since a great number of subject points are simultaneously scanned with the primary beam and the triggered secondary electrons SE are documented in the detector elements HD respectively assigned to the subject points, the time for the examination of the specimen IC is considerably reduced. A large-area scanning of the specimen surface is thereby achieved by deflecting the primary electron beam and/or by mechanical displacement of the specimen IC with reference to the optical axis OA.

Figure 2:
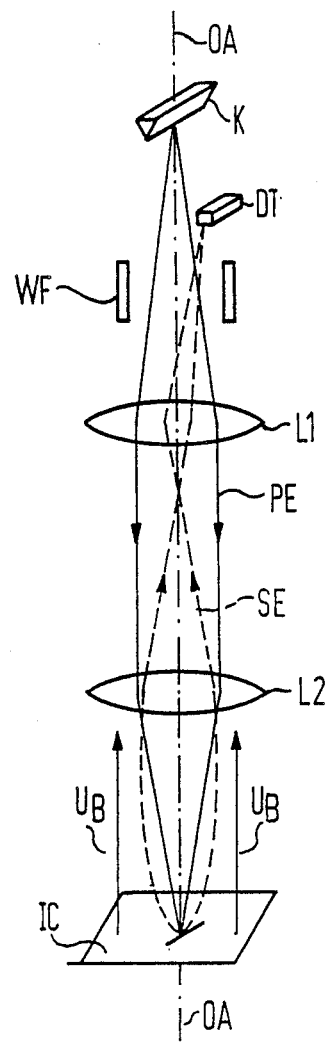
FIG. 2 is another schematic representation of apparatus for implementing the method of the invention.

As is schematically illustrated in FIG. 2, the secondary electrons SE accelerated in the electrical field of the immersion lens OL can also be documented in a detector DT arranged not influence the primary beam or an electrical or, respectively, magnetic multi-pole element WF can be particularly employed as a deflection unit.

Figure 3:
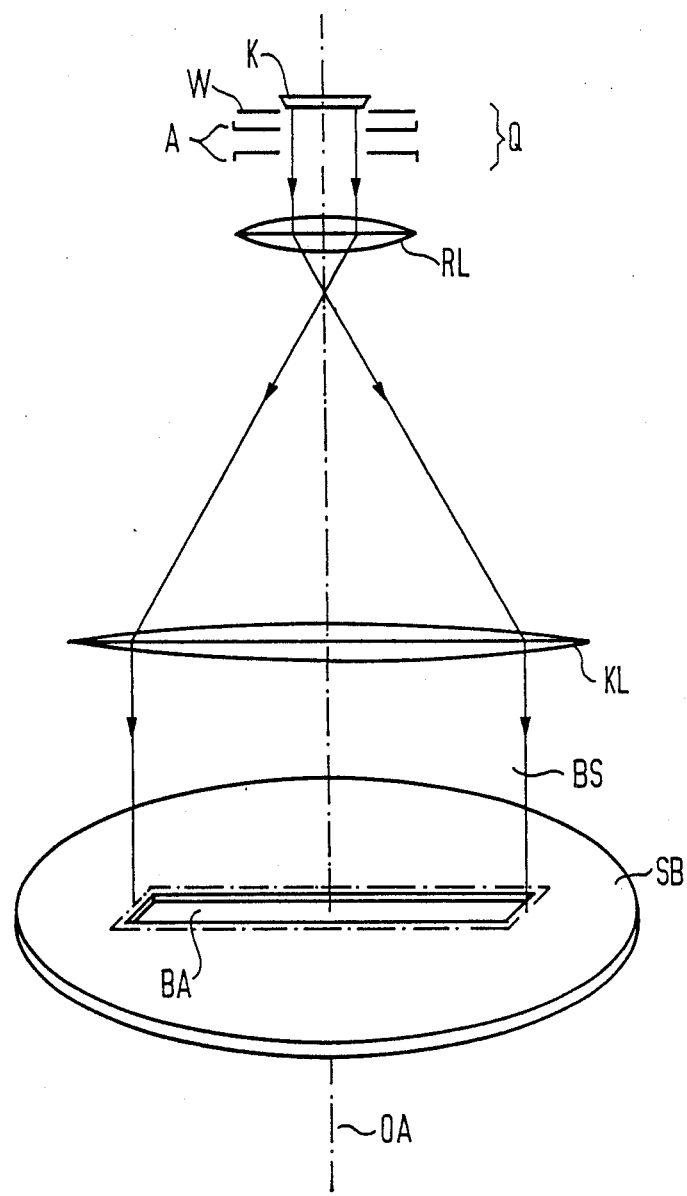
FIG. 3 is a schematic illustration of apparatus for generating a line-shaped electron probe.
Figure 4:
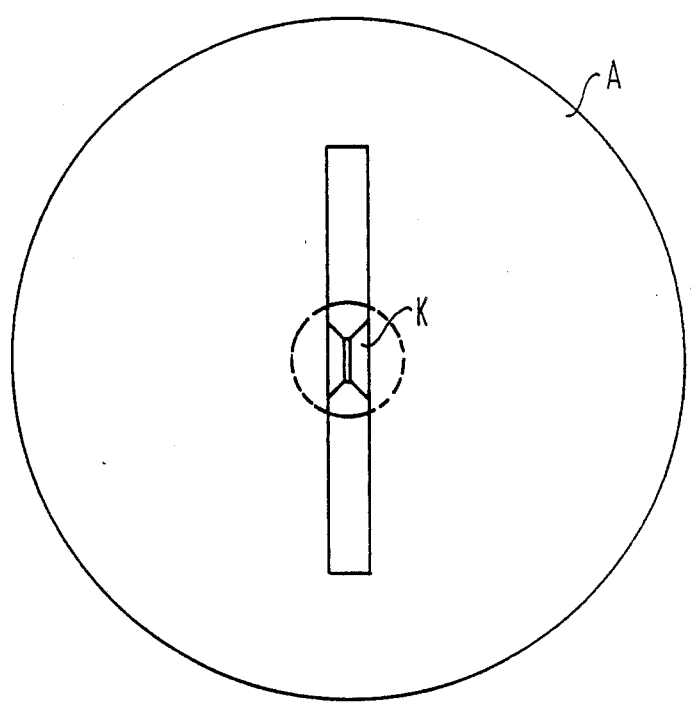
FIG. 4 is another schematic representation of apparatus for generating a line-shaped electron probe.

For scanning the specimen IC, the method of the invention uses an electron probe having a beam cross section whose extent measured in a first direction is far, far greater than in a direction orthogonal thereto ($1_x:1_y > 10:1$). As initially mentioned, a line source that, for example, can be composed of a plurality of individual sources arranged line-like is utilized in generating such an electron probe of demagnifying electron-optical imaging. Of course, it is also possible to illuminate a slotted diaphragm with a round or ribbon-shaped electron beam and the image the diaphragm opening onto the specimen IC in a demagnified manner. As FIG. 3 illustrates, the electron optics for the illumination of the diaphragm SB having a rectangular opening BA comprises, for example, a round lens RL and a magnetic condenser lens KL that are arranged immediately beneath the electron beam generator Q. The latter is preferably composed of a line-shaped cathode K, particularly a LaB6 blade emitter with a flattened tip, of a slotted diaphragm W arranged in the region of the cathode tip, as well as of a double anode A whose electrons are likewise fashioned as slotted diaphragms (see FIG. 4 which shows the beam generator Q in a plan view).

The electron probe that scans the specimen IC is composed of a plurality of sub-beams when the diaphragm SB comprises a line-shaped arrangement of quadratic through openings. It is thereby advantageous to feed each of the subbeams from a separate source. Silicon cold cathodes known from J. Vac. Sci. Technol. A5(4), 1987, pp. 1544-1548, photocathodes (Appl. Phys. Lett. 51.2, 1987, pp. 145-147), Lab6single-crystal blade emitters (U.S. Pat. No. 4,724,328) and the field emission cathodes described in SRI International Technical Note 2, November 1984, for example, may be employed as electron sources.

The invention, of course, is not limited to the described exemplary embodiments. Therefore it is possible to also document back-scattered electrons in the detector instead of secondary electrons. As a consequence of the beam spot geometry, these are likewise triggered in a line-shaped region.

Further lenses can be provided in the described electron beam measuring instrument in order to achieve the necessary demagnification of the primary electron source or, respectively, magnification of the secondary particle source.

Of course, it is also possible to separate the electron-optical beam paths of primary particles and secondary particles and to provide imaging elements for each beam path.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

I claim:

1. A method for examining a specimen in a particle beam instrument in which the specimen is irradiated by a particle probe, comprising the steps of:
   generating a line-shaped cross section particle probe;
   directing the particle probe onto the specimen to cause the generation of a line-shaped secondary particle source; and
   imaging the secondary particle source onto a detector of the particle beam instrument.

2. The method of claim 1, and further comprising the step of:
   detecting the secondary particle source with a plurality of particle-sensitive elements.

3. The method of claim 1, and further comprising the steps of:
   deflecting the secondary particles outside of an optical axis of the particle beam instrument; and
   documenting the deflected secondary particles.

4. The method of claim 3, wherein the step of deflecting is further defined as:
   deflecting the secondary particles with a Wien filter.

5. The method of claim 3, wherein the step of deflecting is further defined as:
   deflecting the secondary particles with an electrical multipole element.

6. The method of claim 3, wherein the step of deflecting is further defined as:
   deflecting the secondary particles with a magnetic multipole element.

7. The method of claim 1, wherein the step of imaging is further defined as:
   imaging the secondary particle source with an immersion lens.

8. The method of claim 1, wherein the step of generating a particle probe is further defined as:
   generating a plurality of individual particle beams.

9. The method of claim 8, wherein the step of generating is further defined as generating the individual beams in a line-like orientation.

10. The method of claim 1, wherein the step of generating a particle probe is further defined as:
    generating a primary beam; illuminate a slotted diaphragm with the primary beam and imaging the diaphragm aperture onto the specimen.

11. The method of claim 1, wherein the step of generating is further defined as generating a particle source with a blade-shaped cathode.

12. The method of claim 1, and further comprising the step of:
    deflecting the particle probe to scan the specimen.

13. The method of claim 1, and further comprising the step of:
    displacing the specimen relative to the particle probe.

* * * * *